United States Patent [19]
Shin

[11] Patent Number: 5,991,206
[45] Date of Patent: Nov. 23, 1999

[54] METHOD OF ERASING A FLASH MEMORY

[75] Inventor: Kye Wan Shin, Inchon, Rep. of Korea

[73] Assignee: Hyundai Electronics Industries Co., Ltd., Kyungki-Do, Rep. of Korea

[21] Appl. No.: 09/207,228

[22] Filed: Dec. 8, 1998

[30] Foreign Application Priority Data

Dec. 10, 1997 [KR] Rep. of Korea ................. 97-67540

[51] Int. Cl.⁶ ........................................... G11C 16/04
[52] U.S. Cl. ........................... 365/185.29; 365/185.22; 365/185.3; 365/218
[58] Field of Search ..................... 365/185.29, 185.3, 365/185.33, 185.22, 218

[56] References Cited

U.S. PATENT DOCUMENTS

| | | | |
|---|---|---|---|
| 5,172,338 | 12/1992 | Mehrotra et al. | 365/185.29 |
| 5,400,286 | 3/1995 | Chu et al. | 365/218 |
| 5,596,530 | 1/1997 | Lin et al. | 365/185.29 |
| 5,663,909 | 9/1997 | Sim | 365/185.22 |
| 5,831,905 | 11/1998 | Hirano | 365/185.29 |
| 5,920,508 | 7/1999 | Miyakawa et al. | 365/185.22 |

FOREIGN PATENT DOCUMENTS

| | | | |
|---|---|---|---|
| 6-231590 | 8/1994 | Japan | G11C 16/06 |
| 8-297985 | 11/1996 | Japan | G11C 16/06 |
| 10-27100 | 1/1998 | Japan | G06F 9/06 |

*Primary Examiner*—Son T. Dinh
*Attorney, Agent, or Firm*—Cohen, Pontani, Lieberman & Pavane

[57] ABSTRACT

This invention discloses a method of erasing a flash memory, in which the method comprises: (A) erasing all cells of a selected sector; (B) verifying in cells whether the cells are erased; (C) saving an address corresponding to a non-erased cell and re-erasing the cells when the non-erased cell is detected by the step (B); (D) verifying in cells, from the saved address to the final address whether the cells are erased; and (E) executing a slight-program for recovering over-erased cells so that the cells of the sector are normally erased.

6 Claims, 15 Drawing Sheets

METHOD OF ERASING A FLASH MEMORY

BACKGROUND OF THE INVENTION

1. Field of the Invention

The present invention relates to a method of erasing a flash memory, and more particularly to a method of erasing a flash memory which can reduce time needed to erase a flash memory made of stack gate type cells.

2. Description of the Prior Art

Typically, a flash memory cain be manufactured by a split gate type cell or a stack gate type cell. An internal erasure algorithm has being used to erase the flash memory having stack gate cells. Such an internal erasure algorithm comprises a pre-program step to prevent the over-erasing, an erasing step, and a post-program step. Namely, the pre-program step is executed in sectors before executing the erasing step so that threshold voltage of all cells are set to a desired voltage. The erasing step and the post-program step are sequentially executed, whereby over erased cells are recovered and the flash memory is normally erased.

FIG. 1 is a block diagram for explaining a conventional method of erasing a flash memory, and is divided into a pre-program block 11, an erasing block 12, and a post-program block 13. The pre-program block 11 has a pre-program step 101 and a pre-program verification step 102. The pre-program step 101 is executed to prevent an over erasure of cells and the pre-program verification step 102 is executed to verify whether the threshold voltage of the pre-programmed cells is identical to a predetermined threshold voltage. The erasing block 12 has an erasing step 103 and an erasing verification step 104. The erasing step 103 is executed to erase the pre-programmed cells. The erasing verification step 104 is executed to verify whether the pre-programmed cells are normally erased. The post-program block 13 has a post-program step 105 and a post-program verification step 106. The post-program step 105 is executed to recover over erased cells among the erased cells. The post-program verification step 106 is executed to verify whether the over erased cells are recovered.

FIG. 2 is a flow chart for explaining a conventional method of erasing a flash memory. If an erasing command is input (201), an address counter and a fail counter are reset. According to a pre-program command(202), cells selected by addresses are programmed in bytes or words (203). To verify whether the cells are programmed, program verification is executed(204). As the result of the program verification, a step(205) is executed to check whether the program verification is passed. If the program verification is not passed as the results of the above step(205), a step(206) is executed to check whether the fail counter is a maximum. If the fail counter is maximum, the erasing process is considered as failure and the erasing process is ended. If the fail counter is not maximum, the counter value of the fail counter is increased(202) and the above steps(203, 204, 205) are executed again. If the program verification is successfully passed as the result of the above step(205), a step(208) is executed to check whether the address is the final address of the sector. If the address is not the final address of the sector, the address is increased(209) and the steps (203,204, 205 and 208) are executed again. If the address is the final address of the sector as the result of the above step(208), the address and the fail counter are reset and an erasing step starts(210).

Information stored on the cells is erased according to the erasing command(211). In a step(212), an erasure verification is executed. In a step(213), it decides whether the erasure verification is passed. As the result of the above step(213), if the erasure verification is not passed, it is decided whether the fail counter is maximum at a step(214). If the fail counter is not maximum, counter value of the fail counter is increased(215) and the above steps(211, 212, 213) are executed again. If the fail counter is maximum, the erasure operation is ended. As the result of the above step(213), if the erasure verification is passed, it is decided whether a current address is the final address of the sector (216). If it is not the final address, the current address is increased by an address counter(217) and the above step are executed again. If the current address is the final address, the address counter and the fail counter are reset and a post-program is executed(218). The post-program verification is executed at a step(219). In a step(220), it is decided whether the post-program verification is passed. As the result of the above step(220), if the post-program verification is not passed, it is decided whether the fail counter is maximum at a step(221). If the fail counter is not maximum, counter value of the fail counter is increased(215) and the above steps(218, 219, 220) are executed again. If the fail counter is maximum, the post-program is ended. As the result of the above step(220), if the post-program verification is passed, it is decided whether a current address is the final sector address(223). As the result of the above step(223), if the current address is not the final address of the sector, the current address is increased by the address counter(224) and the above steps(218, 219, and 220) are executed again. As result of the above step(223), if the current address is the final address of the sector, an erasure operation is considered as pass and the erasure operation is ended.

However, such erasing method needs much erasing time for the pre-program step and the post-program step related to over-erased cells, not to an actual erasing process, and for verification time of each step.

SUMMARY OF THE INVENTION

Accordingly, it is an object of the present invention to provide a method of erasing a flash memory which can simplify the erasing process of the flash memory having the stack gate type cells and reduce the time needed for erasing.

A method of erasing a flash memory of the present invention comprising the steps of: (A) erasing all cells of a selected sector; (B) verifying in cells whether the cells are erased; (C) saving an address corresponding to a non-erased cell and re-erasing the cells when the non-erased cell is detected by the step (B); (D) verifying in cells, from the saved address to the final address whether the cells are erased; and (E) executing a slight-program for recovering over-erased cells so that all cells of the sector are normally erased.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

Detailed Description of the Preferred Embodiments

Reference will now be made in detail to the preferred embodiments of the present invention, and examples of which are illustrated in the accompanying drawings.

Figure 1:
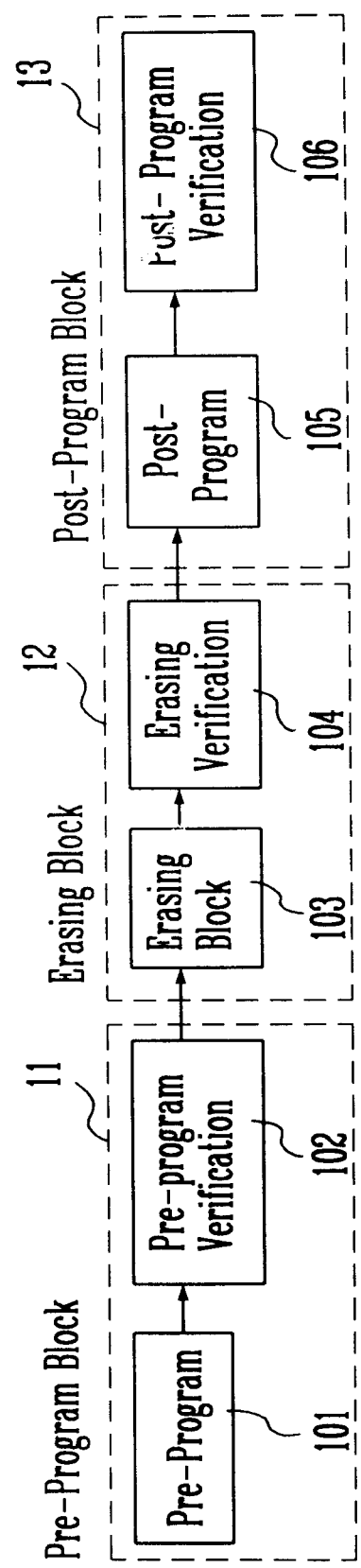
FIG. 1 is a block diagram illustrating a conventional method of erasing a flash memory.
Figure 2:
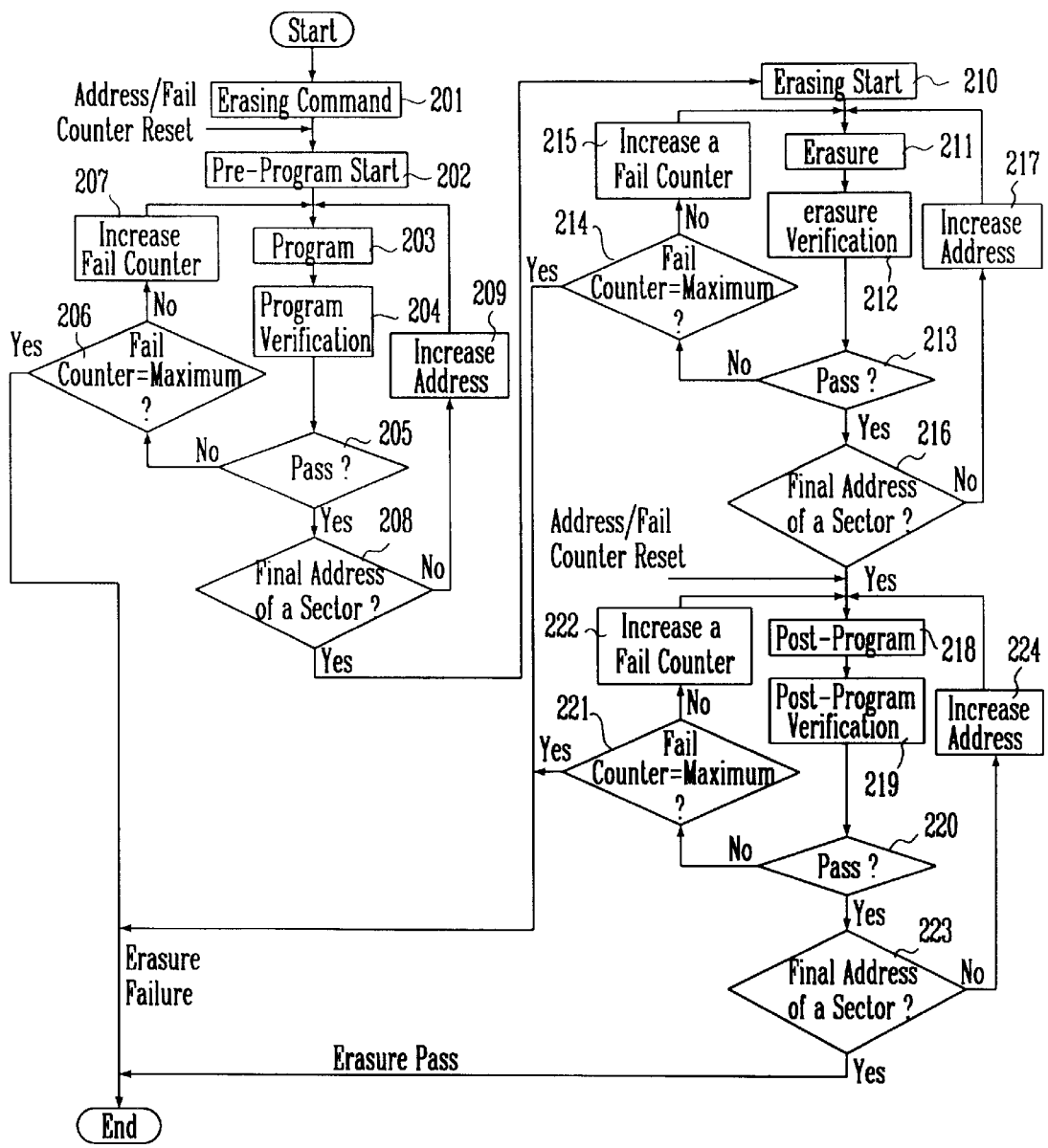
FIG. 2 is a flow chart for explaining a conventional method of erasing a flash memory.
Figure 3:
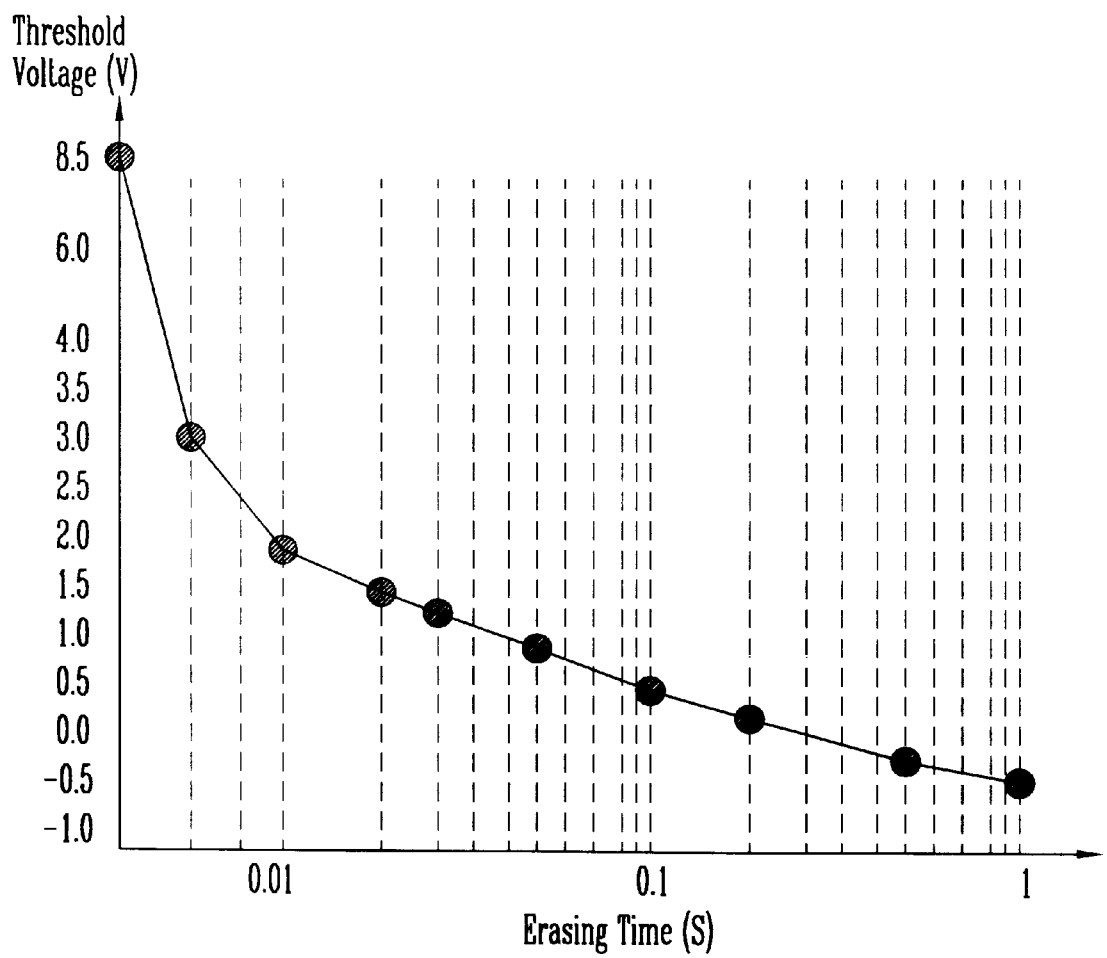
FIG. 3 is a graph for explaining features of threshold voltage of a flash memory cell depending on the erasing time.

FIG. 3 is a graph for explaining features of threshold voltage of a flash memory cell. As shown in FIG. 3, threshold voltage of a flash memory cell is exponentially decreased when the cell is erased. Namely, an over-erasing is not occurred linearly depending on time. Also, though cells having different threshold voltage from each other are erased at the same time, threshold voltage difference of the cells is remarkably reduced after a specified time. Thus, though cells with each different threshold voltage are erased at the same time without executing a pre-program process at the time of erasing, threshold voltage difference of the erased cells remarkably is reduced after a specified time.

Figure 4A:
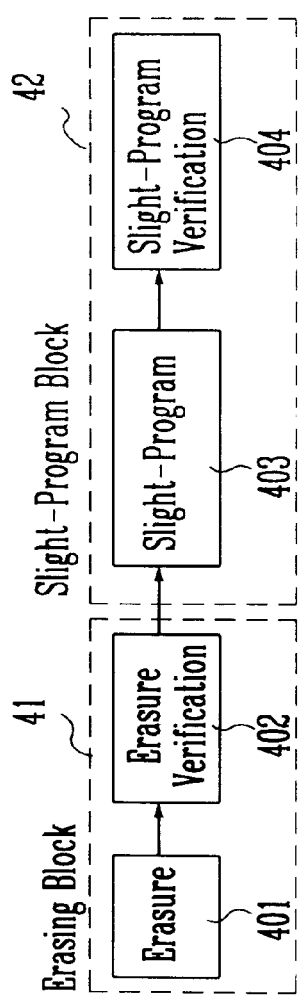
FIGS. 4A and 4B are block diagrams illustrating a method of erasing a flash memory in accordance with the present invention.
Figure 4B:
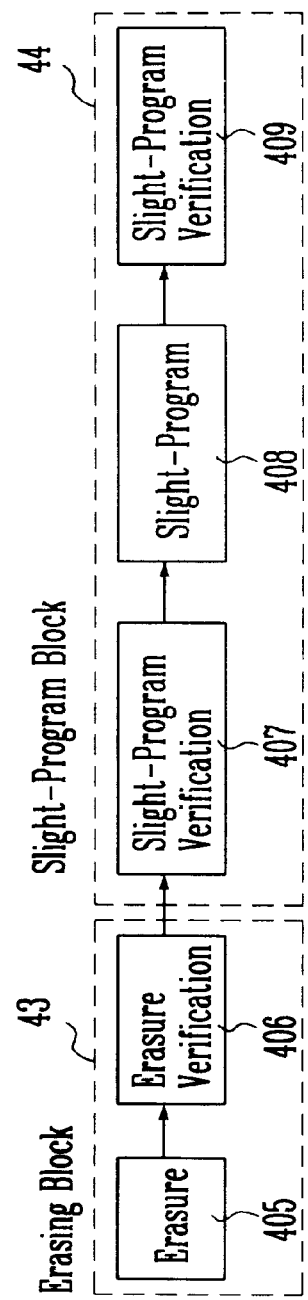

FIGS. 4A and 4B are block diagrams illustrating a method of erasing a flash memory in accordance with the present invention.

By omitting the pre-program step which occupy relatively much time in the erasing process using the conventional internal erase algorithm, and replacing the post-programming step to a slight-program step, time for the erasing process may be reduced. Therefore, the erasing process is divided into an erasing step and a slight-programming step.

FIG. 4A shows an erasing method having an erasing block 41 and a slight-program block 42. The erasing block 41 has an erasing step 401 and an erasing verification step 402. The slight-program block 42 has a slight-program step 403 and a slight-program verification step 404.

FIG. 4B shows an erasing method having an erasing block 43 and a slight-programming block 44. The erasing block 43 has an erasing step 405 and an erasing verification step 406. The slight-program block 44 has a slight-program verification step 407, a slight-program step 408 and a slight-program verification step 409.

The erasing method as described above method will be explained as follows. Cells of a selected sector are erased without the pre-program process and an erasing verification process is then executed to verify whether the cells are normally erased. As the result of the erasing verification, if the cells are not normally erased, the erasing process is executed again. If the verification for all cells is passed, the slight-program process is executed. The slight-program is executed in all sectors so that threshold voltage of all cells may reach the desired threshold voltage, with the slight-program process being divided into a program step and a verification step.

Figure 5:
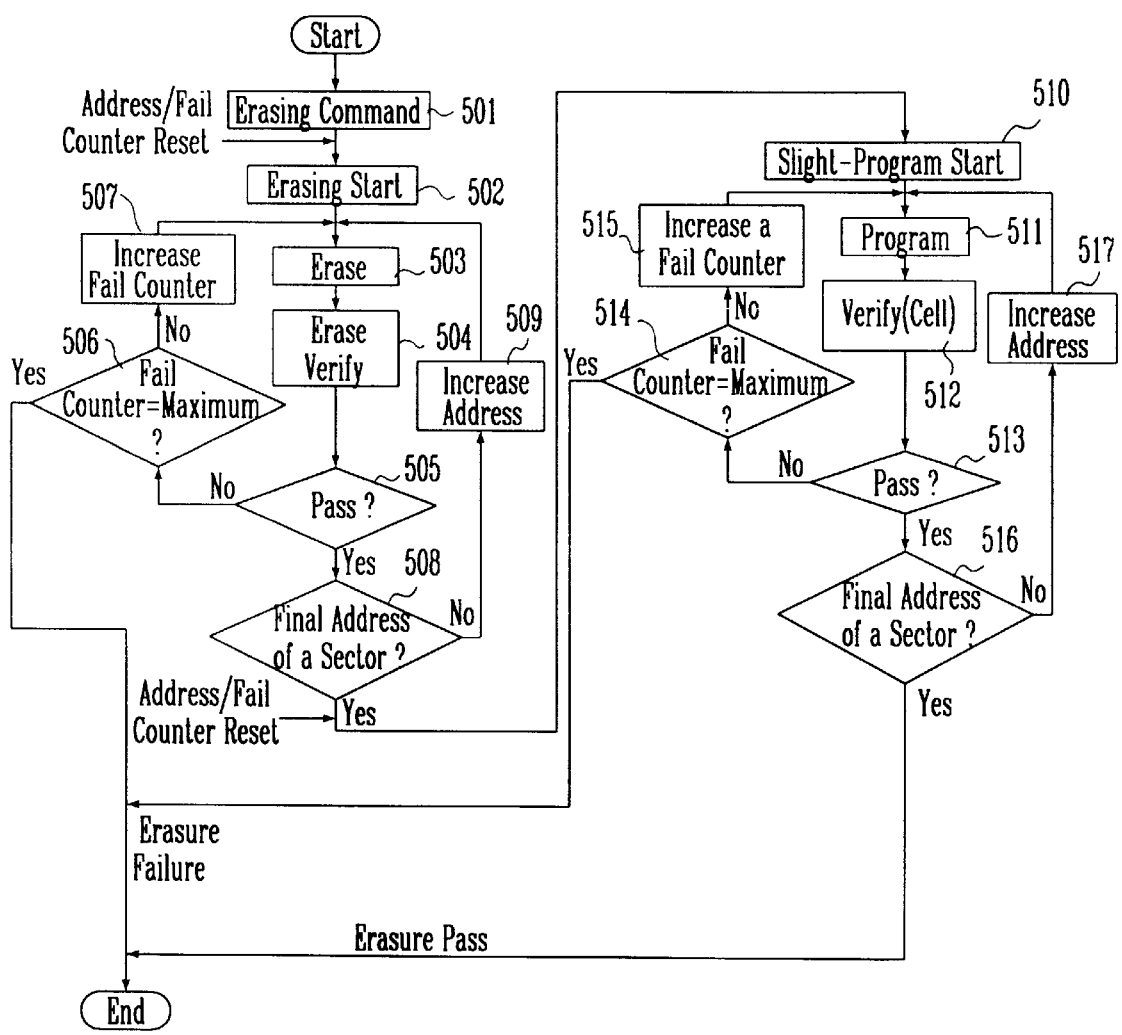
FIG. 5 is a flow chart illustrating a method of erasing a flash memory according to a first embodiment of the present invention.

FIG. 5 is a flow chart to show a method of erasing a flash memory according to a first embodiment of the present invention.

An address counter and a fail counter are reset if an erasing command is input at a step 501, and an erasing is started at a step 502. Cells of a selected sector are erased by an erasing step 503. An erasing verification 504 is executed to verify whether the cells are erased. In a step(505), it is verified whether the erasing verification is passed. If the erasing verification is not passed, a current address is saved and it is determined whether the fail counter is maximum in a step(506). If the fail counter is not maximum, an erasure operation is considered as failure and is ended, while the fail counter is maximum, counter value of the fail counter is increased in a step(507) and the above steps(503, 504, 505) are executed again. In the above step(505), if the erasing verification is passed, it is determined whether a current address is the final address of a sector(508). If a current address is not the final address, address is increased(509) and the erasing verification (504) is executed again, while if a current address is a final address, the address counter and the fail counter are reset and a slight-programming is started(510).

In a step(511), programming operation is executed in bytes or words if the slight-programming step is started. Cells of a selected sector are erased by the program step (511). A program verification (512) is executed to verify whether the cells are programmed. In a step(513), it is verified whether the program verification is passed. If the program verification is not passed, a current address is saved and it is determined whether the fail counter is maximum in a step(514). If the fail counter is not a maximum value, an erasure operation is considered as failure and is ended, while the fail counter is maximum, counter value of the fail counter is increased in a step(515) and the above steps(511, 512, 513) are executed again. In the above step(513), if the program verification is passed, it is determined whether a current address is the final address of a sector(516). If a current address is not the final sector address, address is increased(517) and the program verification step(511) is executed again, while if a current address is a final sector address, the erasing operation is considered as pass and is ended.

Figure 6:
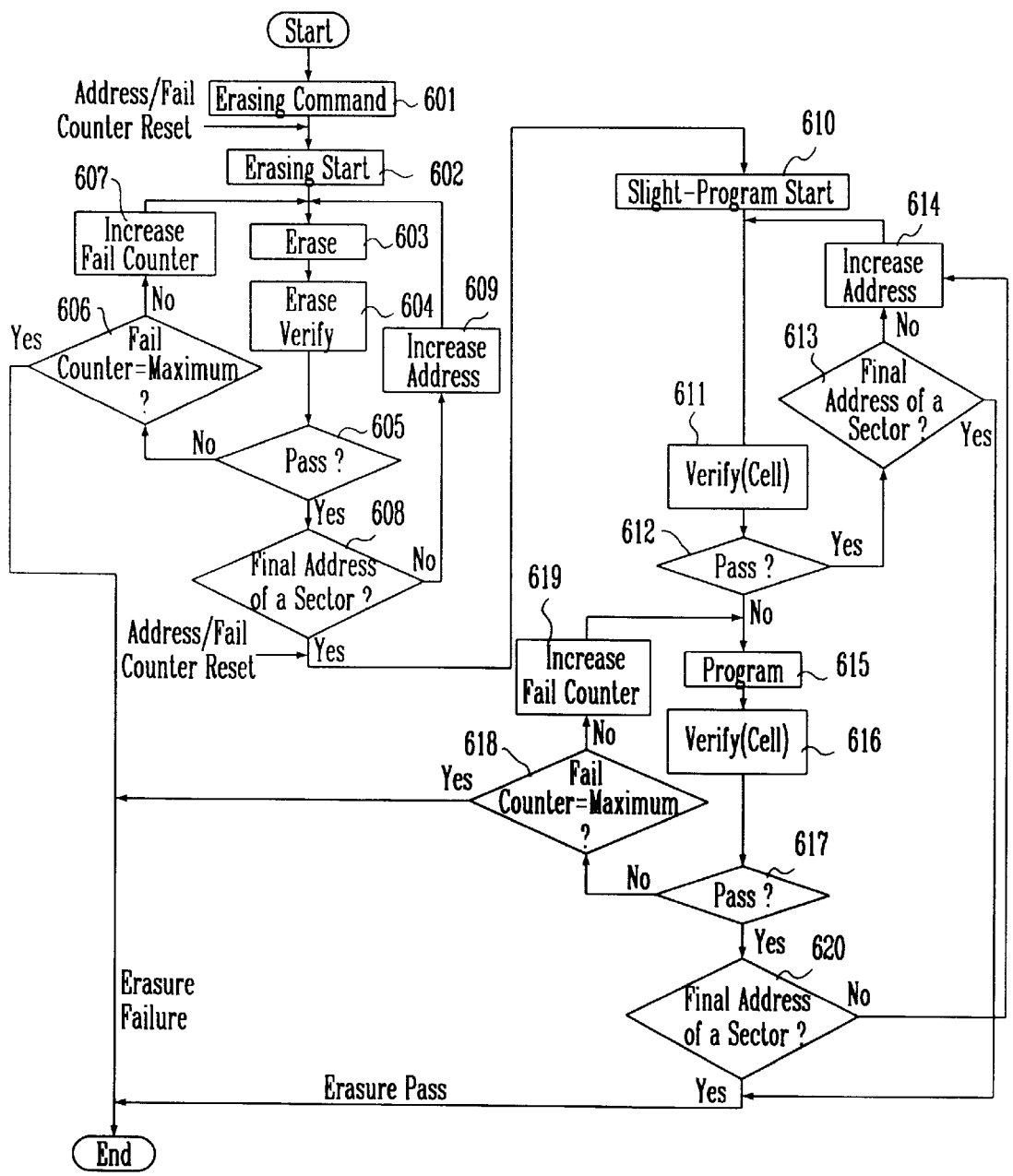
FIG. 6 is a flow chart illustrating a method of erasing a flash memory according to a second embodiment of the present invention.

FIG. 6 is a flow chart to show a method of erasing a flash memory according to a second embodiment of the present invention.

An address counter and a fail counter are reset if an erasing command is input(601), and an erasing operation is started(602). Cells of a selected sector are erased by an erasing step(603). An erasing verification (604) is executed to verify whether the cells are erased. In a step(605), it is verified whether the erasing verification is passed. If the erasing verification is not passed, a current address is saved and it is determined whether the fail counter is maximum in a step(606). If the fail counter is maximum, an erasure operation is considered as failure and is ended, while the fail counter is not maximum, counter value of the fail counter is increased in a step(607) and the above steps(603, 604, 605) are executed again. In the above step(605), if the erasing verification is passed, it is determined whether a current address is the final address of a sector(608). If a current address is not the final address, address is increased(609) and the erasing verification step(604) is executed again, while if a current address is a final address, the address counter and the fail counter are reset and a slight-programming is started(610).

In a step(611), a programming verification is executed to verify whether the cells are over erased. In a step(612), it is verified whether the verification is passed. If the verification is passed, it is determined whether a current address is the final address of a sector(613). If the current address is the final address, the erasing operation is considered as pass and is ended. If the current address is not the final address, the current address is increased(614) and the above step(611) is executed again. In a above step(612), if the verification is not passed, that is, a selected cell is over erased, the selected cell is programmed(615). In a step(616), it is verified whether the programmed cell is normally programmed. In a step (617), it is determined whether the verification of the above step(616) is passed. If the verification is passed, it is determined whether the fail counter is maximum in a step(618). If the fail counter is maximum, an erasure operation is considered as failure and the erasure operation is ended, while the fail counter is not maximum, counter value of the fail counter is increased in a step(619) and the above steps(615, 616, 617) are executed again. In the above step(617), if the verification is passed, it is determined whether a current address is the final address of a sector (620). If a current address is not the final address, address is increased(614) and the above step(611) is executed again, while if a current address is the final address, the erasing operation is considered as pass and the erasure operation is ended.

The method as described above will be summarized as follows. This is the method to proceed to the next address if it is successful by verification in bytes or words before programming, to execute programming for the address only in case of fail, and to proceed to the next address if it is successful by re-verification for the programmed cells. This method may reduce the entire program time because program does not executed for the cell not to need slight-program after erasing.

Figure 7:
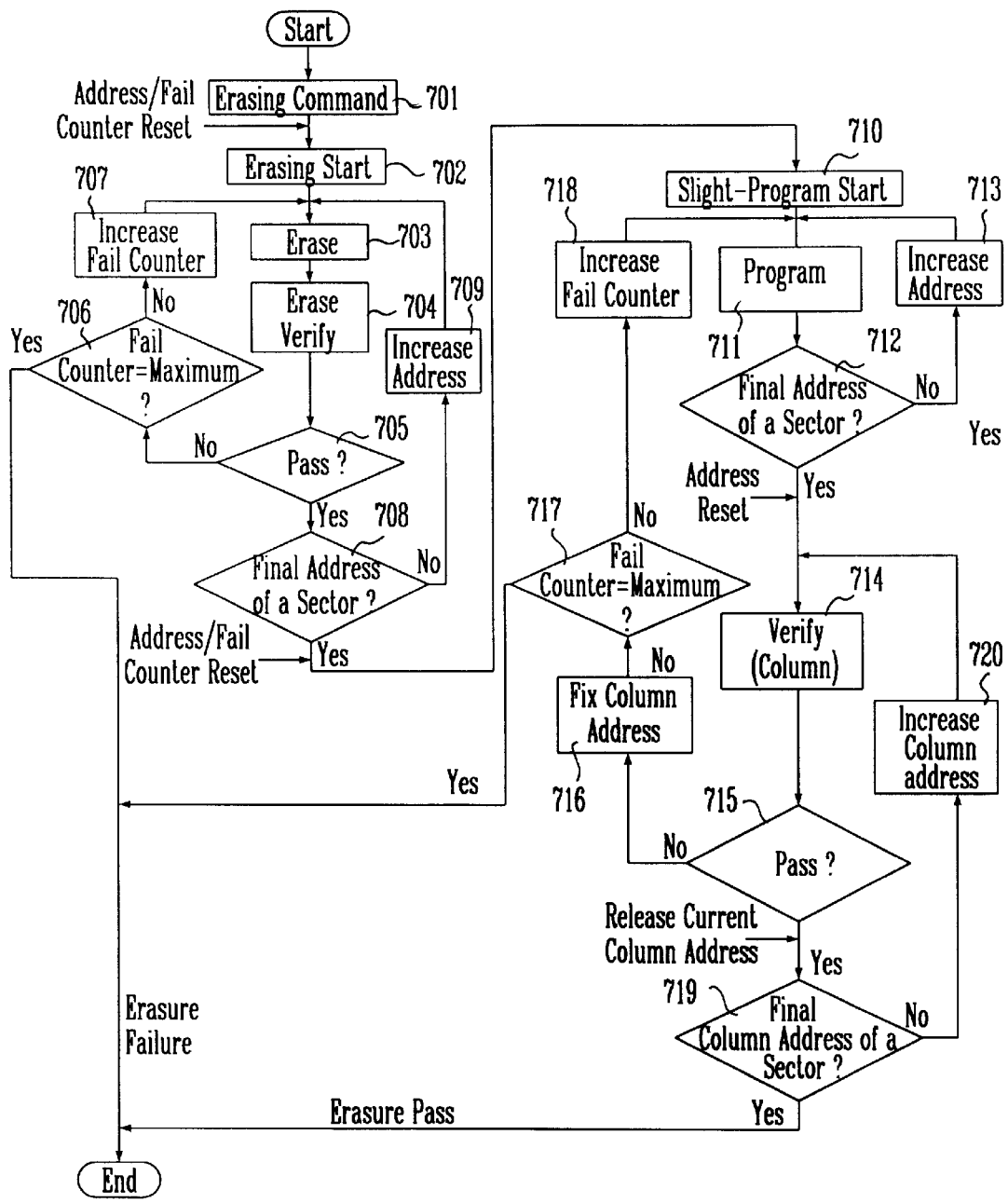
FIG. 7 is a flow chart illustrating a method of erasing a flash memory according to a third embodiment of the present invention.

FIG. 7 is a flow chart illustrating a method of erasing a flash memory device according to a third embodiment of the present invention. This is the method to execute verification in columns after programming all cells in a sector in bytes or words. The case to generate trouble due to over-erasing of elements is from the normal sector, not from the erased sector. The case that data is read wrong at the time of reading may occur, but it becomes another case from different point of view at the time of programming. Weak channel is formed due to over-erasing when the pumping current for programming is applied to the column to which over-erased cells are connected if over-erasing occurs in the erasing sector. Current path is formed to the cells with such weak channels, and enough current is not provided to the cells for programming. Accordingly, entire programming time may be reduced as considerable amount of time may be reduced if verification is executed by detecting the maximum over-erasing state that current may be applied to the column for enough programming after verifying the erasing threshold voltage by more than over erasing threshold voltage. Detailed erasing is described in the following.

An address counter and a fail counter are reset if an erasing command is input(701), and an erasing step is started(702). Cells of a selected sector are erased by an erasing step(703). An erasing verification (704) is executed to verify whether the cells are erased. In a step(705), it is verified whether the erasing verification is passed. If the erasing verification is not passed, a current address is saved and it is determined whether the fail counter is maximum in a step(706). If the fail counter is maximum, an erasure operation is considered as failure and is ended, while the fail counter does not maximum, counter value of the fail counter is increased in a step(707) and the above steps(703, 704, 705) are executed again. In the above step(705), if the erasing verification is passed, it is determined whether a current address is the final address of a sector(708). If a current address is not the final address of a sector, address is increased(709) and the erasing verification step(704) is executed again, while if a current address is a final address of a sector, the address counter and the fail counter are reset and a slight-programming is started(710).

In a step(711), program operation is executed in bytes or words if the slight-programming is started. Cells of a selected sector are programmed by the programming step (711). In a step(712), it is determined whether a current address is a final address of a sector. If the current address is not a final address, the current address is increased(713) and the above step (711) is executed again. That is, the program operation is repeated until a current address becomes the final address. If the current address is the final address, the address resets and a program verification step (714) is executed in columns. In a step(715), it is verified whether the programming verification is passed. If the programming verification does not passed, a current column address is fixed(716) and it is determined whether the fail counter is maximum in a step(717). If the fail counter is maximum, an erasure operation is considered as failure and the erasure operation is ended, while the fail counter does not maximum, counter value of the fail counter is increased in a step(718) and the above steps(711, 712, 713, 714, 715) are executed again. In the above step(715), if the programming verification is passed, it is determined whether a current column address is the final column address(719). If a current column address is not the final column address, the current column address is increased(720) and the above steps(714, 715, 719) are executed again, while if a current column address is the final column address, the erasing operation is considered as pass and the erasure operation is ended.

Figure 8:
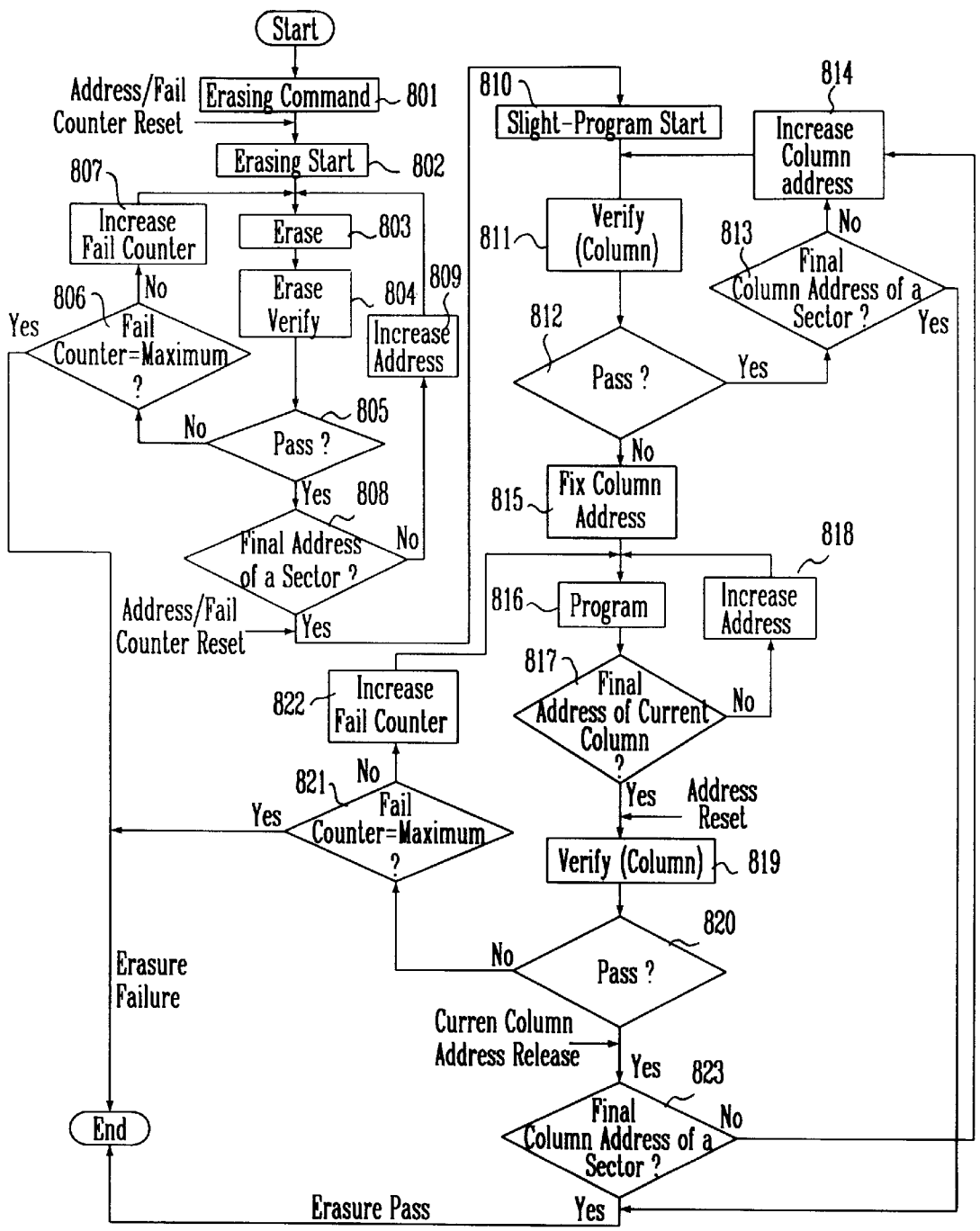
FIG. 8 is a flow chart illustrating a method of erasing a flash memory according to a fourth embodiment of the present invention.

FIG. 8 is a flow chart to show a method of erasing a flash memory device according to a fourth embodiment of the present invention. This is a method to execute verification of a column first and to proceed to the next column address for the case of success, but to execute re-verification after programming all columns by changing only word lines only for the failed columns when the verification fails and to proceed to the next column in case of success. By such process, entire programming time may be reduced because programming for the column not to need programming is not executed in the method for verification of columns. Detailed process is described in the following.

An address counter and a fail counter are reset if an erasing command is input(801), and an erasing step is started(802). Cells of a selected sector are erased by an erasing step(803). An erasing verification step(804) is executed to verify whether the cells are erased. In a step (805), it is verified whether the erasing verification is passed. If the erasing verification does not passed, a current address is saved and it is determined whether the fail counter is maximum in a step(806). If the fail counter is maximum, an erasure operation is considered as failure and is ended, while the fail counter does not maximum, counter value of the fail counter is increased in a step(807) and the above steps(803, 804, 805) are executed again. In the above step(805), if the erasing verification is passed, it is determined whether a current address is the final address of a sector(808). If a current address is not the final address, a current address is increased(809) and the erasing verification (804) is executed again, while if a current address is a final address, the address counter and the fail counter are reset and a slight-programming is started(810).

In a step(811), verification(811) is executed in columns to verify whether cells are over erased. In a step(812), it is determined whether the verification(811) is passed. If the verification is passed, it is determined whether a current column address is the final column address of a sector(813). If a current column address is not the final column address, a current column address is increased(314) and the above steps(811, 812) are executed again. If a current column address is the final column address, the erasure operation is considered as pass and the erasure operation is ended. In a above step(812), the verification does not passed, that an over-erased cell exists, a current column address is fixed (815) and programming operation is executed in cells(816). In a step(817), it is determined whether a current address is the final address of the current column. If the current column address is not the final column address, a current column address is increased(818) and the above step(816, 817) are executed again. If the current column address is the final column address, address is reset and verification is executed in columns(819). In a step(819), it is determined whether the verification is passed. If the verification does not passed, it is determined whether the fail counter is maximum in a step(821). If the fail counter is maximum, an erasure operation is considered as failure and the erasure operation is ended, while the fail counter does not maximum, counter value of the fail counter is increased in a step(822) and the above steps(816,817, 818, 819, 820) are executed again. In the above step(820), if the verification is passed, it is determined whether a current column address is the final column address of a sector(823). If a current column address is not the final column address, the current column address is increased(814) and the above steps(811 to 823) are executed again, while if a current column address is a final address, the erasing operation is considered as pass and the erasure operation is ended.

Figure 9:
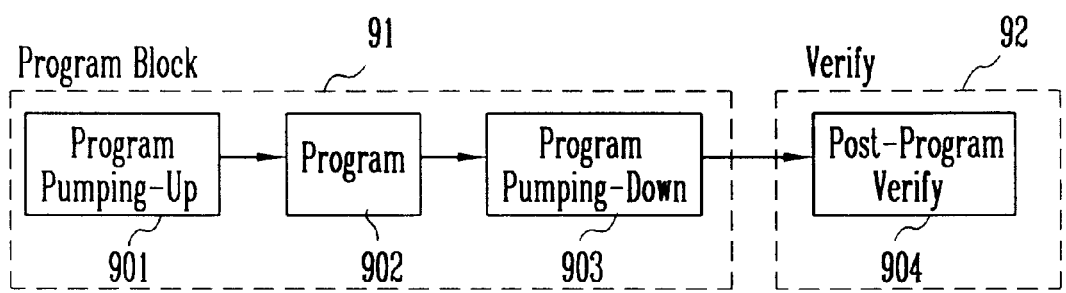
FIG. 9 is a block diagram illustrating a program method.

FIG. 9 is a block diagram illustrating a general programming, method and is divided into a programming block(91) and a verification block(92). The programming block(91) comprises a program pumping-up step(901), a programming step(902) and a program pumping-down step (903).

Figure 10:
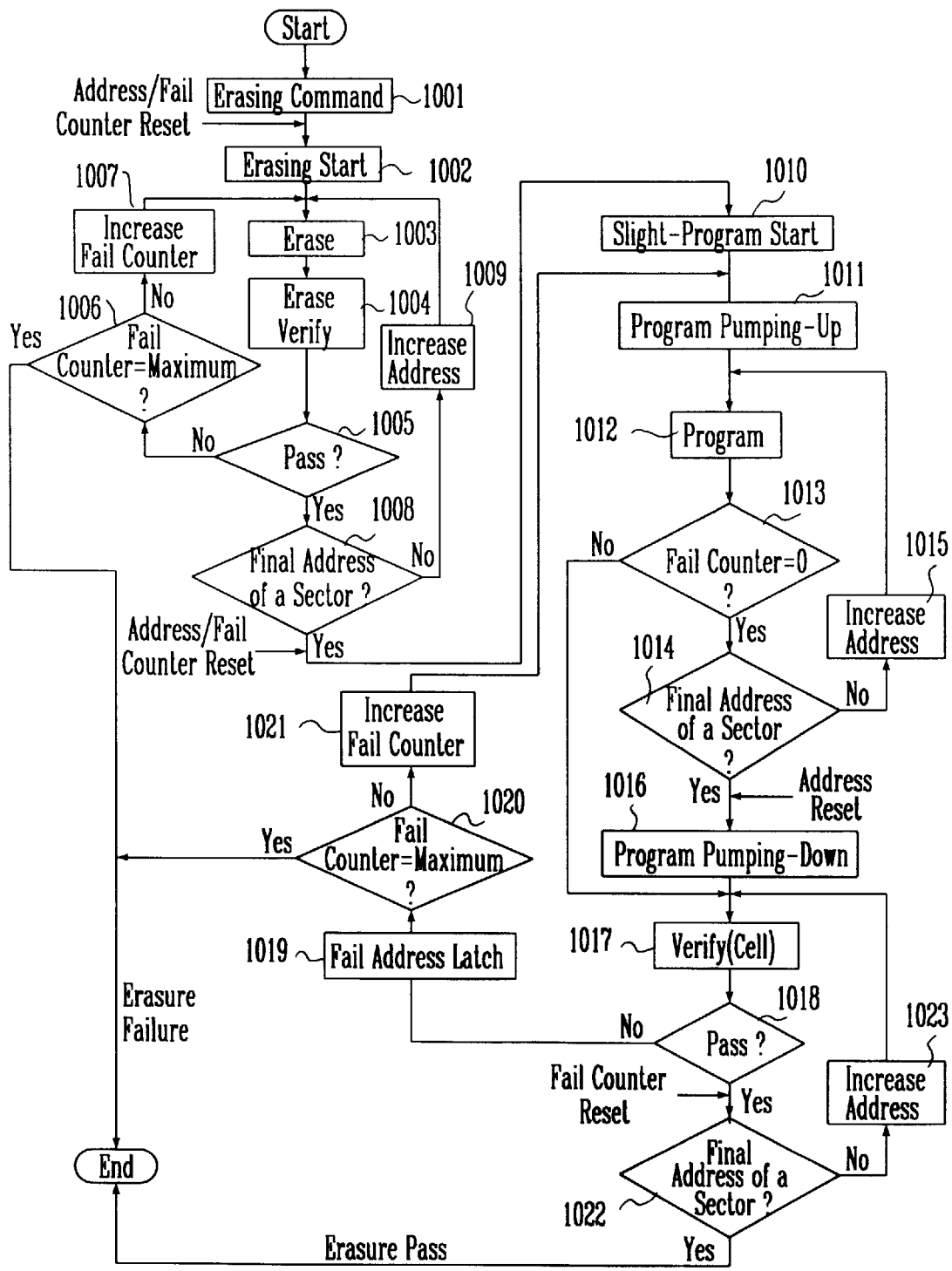
FIG. 10 is a flow chart illustrating a method of erasing a flash memory according to a fifth embodiment of the present invention.

FIG. 10 is a flow chart illustrating a method of erasing a flash memory device according to the fifth embodiment of the present invention. This is the method to reduce the entire programming time by executing continuous programming and reducing the pumping-up and pumping-down process needed in programming.

An address counter and a fail counter are reset if an erasing command is input(1001), and an erasing step is started(1002). Cells of a selected sector are erased by an erasing step(1003). An erasing verification step(1004) is executed to verify whether the cells are erased. In a step (1005), it is verified whether the erasing verification is passed. If the erasing verification does not passed, a current address is saved and it is determined whether the fail counter is maximum in a step(1006). If the fail counter is maximum, an erasure operation is considered as and is ended, while the fail counter is maximum, counter value of the fail counter is increased in a step(1007) and the above steps(1003, 1004, 1005) are executed again. In the above step(1005), if the erasing verification is passed, it is determined whether a current address is the final address of a sector(1008). If a current address is not the sector address, address is increased (1009) and the erasing verification step(1004) is executed again, while if a current address is the final address, the address counter and the fail counter are reset and a slight-programming is started(1010).

In a step(1011), pumping-up operation is executed and programming operation is executed (1012). It is determined whether the fail counter is zero(0) at a step(1013). If the fail counter is zero, it is determined whether a current address is the final address of a sector(1014). If the current address is not the final sector address, the current address increases (1015) and the above steps(1012, 1013, 1014) are executed again. If the current address is the final sector address, pumping-down operation is executed at a step(1016). In the above step(1013), if the fail counter is not zero or the pumping-down operation is completed, verification is executed in cells(1017). In a step(1018), it is determined whether the verification is passed. If the verification is not passed, a fail address is latched(1019) and it is determined whether the fail counter is maximum value. If the fail counter is maximum value, the erasure operation is considered as failure and the erasure operation is ended, while the fail counter does not maximum, the fail counter is increased (1021) and the above steps(1011 to 1018) are executed again. If the verification is passed, it is determined whether a current sector address is the final address of a sector(1022). If the current sector address is not the final sector address, an address is increased(1023) and the above steps(1017 to 1022) are executed again, while if the current sector address is the final address, the erasure operation is considered as pass and the erasure operation is ended.

Figure 11A:
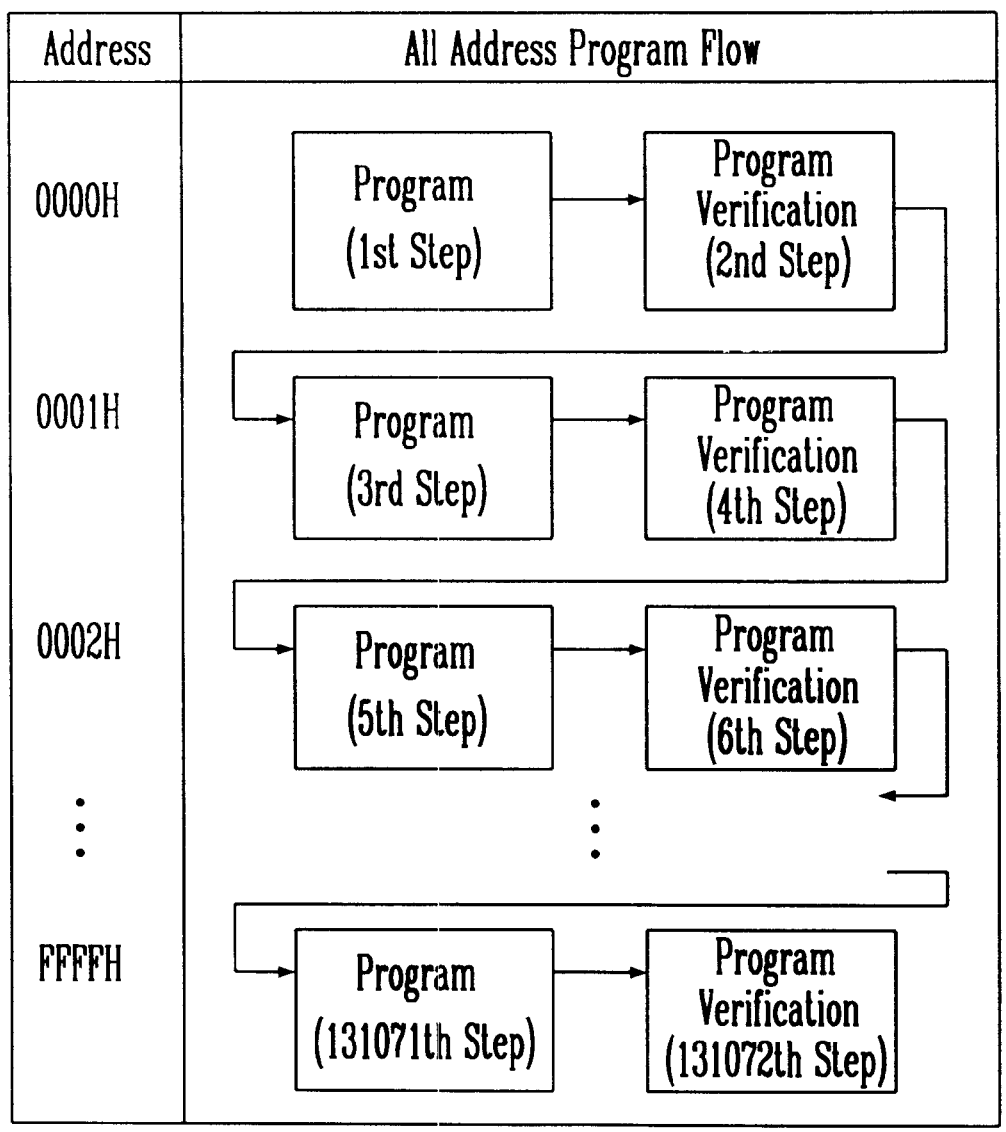
FIGS. 11A to 11E are functional block diagrams illustrating the address in slight-program and the flow of the address program.
Figure 11B:
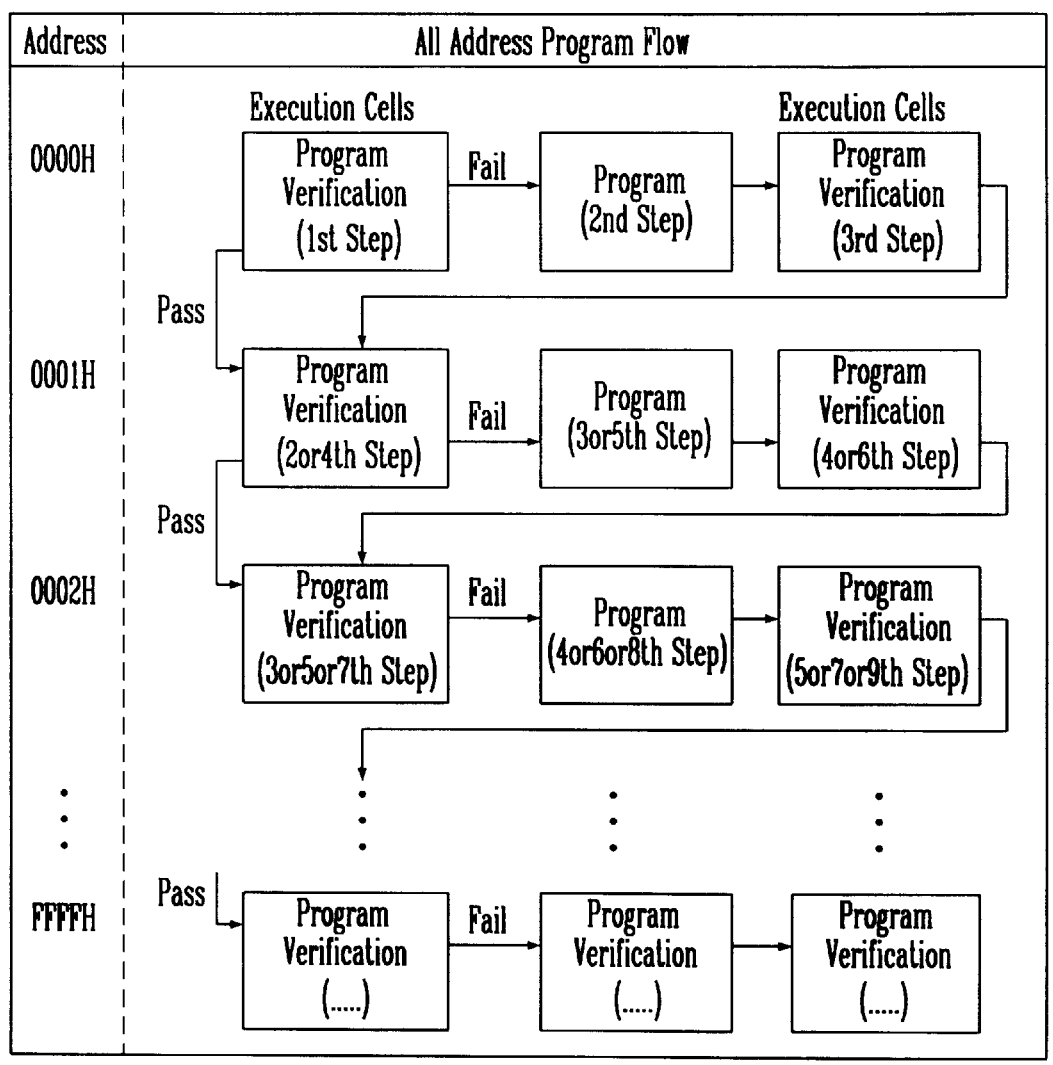

FIG. 11A and 11B are functional block diagrams to show the address in slight-programming and the flow of address programs in erasing the flash memory in accordance with the present invention. The case to program the address from 0000H to FFFH is shown in the block diagrams.

FIG. 11A is a functional block diagram to show the address and the flow of address programs in slight-programming of erasing the flash memory according to the 1st exemplification of the present invention, shown in FIG. 5. As shown in FIG. 5, the slight-programming is the method to execute the process to program and verify cells of the corresponding address for all addresses in a sector repeatedly. Namely, verification is executed if programming starts for all cells in the corresponding address(0000H). Then, verification is executed after programming cells corresponding to the next address(0001H) if the above verification is successful. The slight-programming process is completed for all cells in a sector by programming and verifying cells up to the final address(FFFFH).

FIG. 11B is a functional block diagram to show the address and the address program flow in slight-programming of erasing the flash memory according to the 2nd exemplification of the present invention, shown in FIG. 6. As described in FIG. 6, verify the next address(0001H) in case of success, by executing verification for the corresponding address(0000H) first. Proceed to The next address(0001H) and verify the cells after programming and re-verifying cells in the address(0000H) of first verification if verification fails. Programming is executed for all cells in the sector by such a repeated process. Such a method may reduce entire programming time, by omitting the programming process for the cell not to need the slight-programming process after erasing.

Figure 11C:
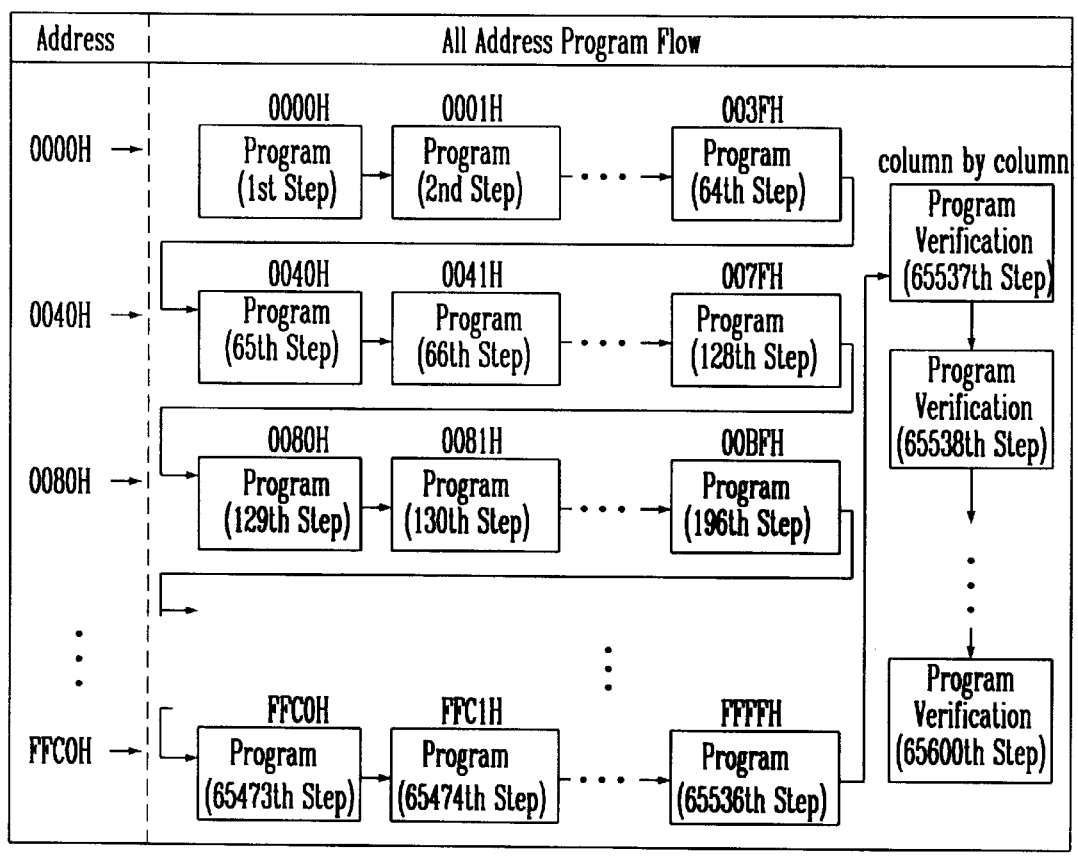

FIG. 11C is a functional block diagram to show the address and the address program flow in slight-programming of erasing the flash memory according to the 3rd exemplification of the present invention, shown in FIG. 7. As shown in FIG. 7, this is the method to execute continuous verification to the column after programming sequentially all cells in a sector in which erasing is executed.

Figure 11D:
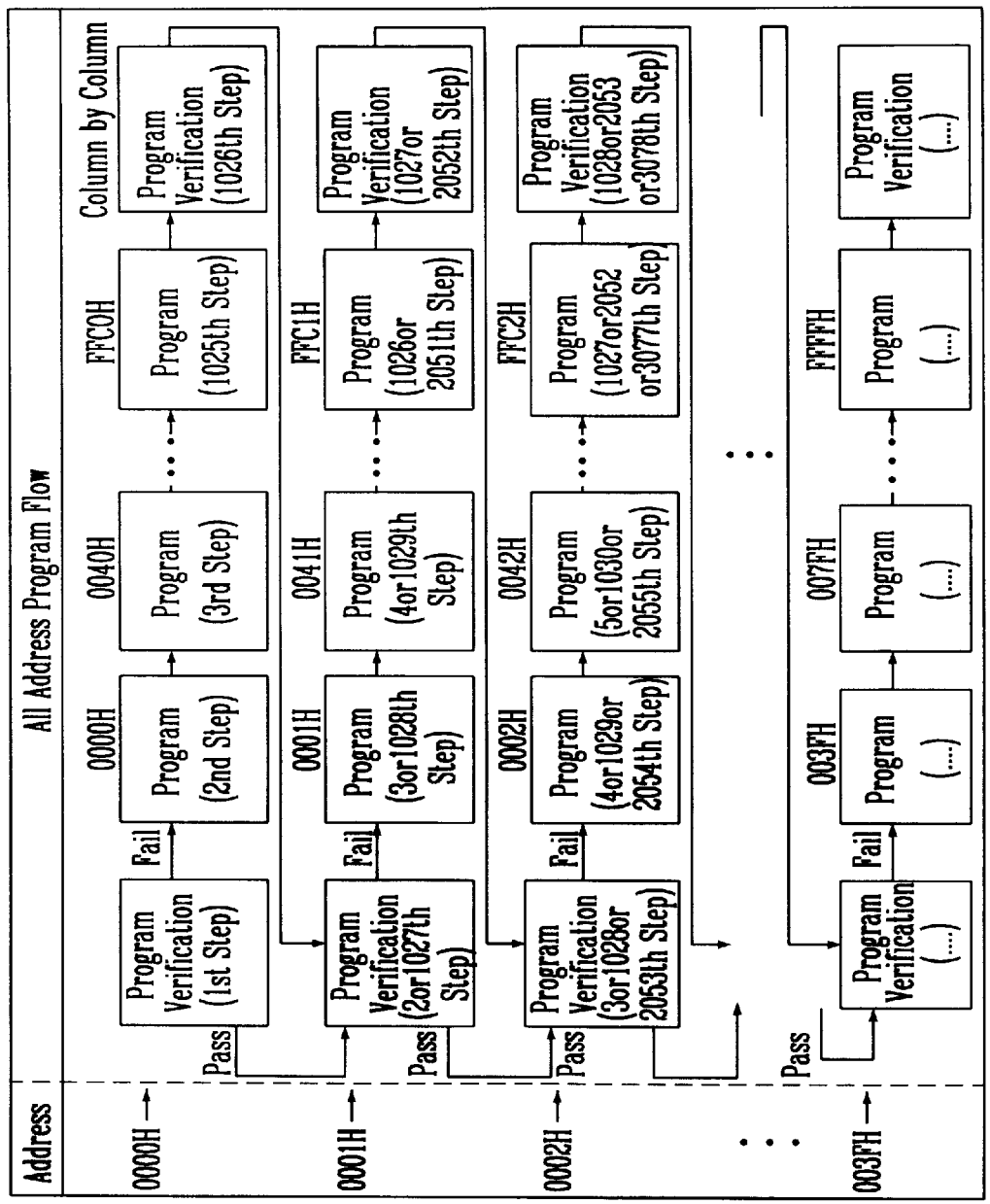

FIG. 11D is a functional block diagram to show the address and the address program flow in slight-programming of erasing the flash memory according to the 4th exemplification of the present invention, shown in FIG. 8. As shown in FIG. 8, execute verification for a column first, verify the next column address if verification is successful, and execute programming if it is fail. Execute re-verification after programming all cells corresponding to one column. The slight-programming is executed up to the final sector address by changing word lines and repeating the process for the next column.

Figure 11E:
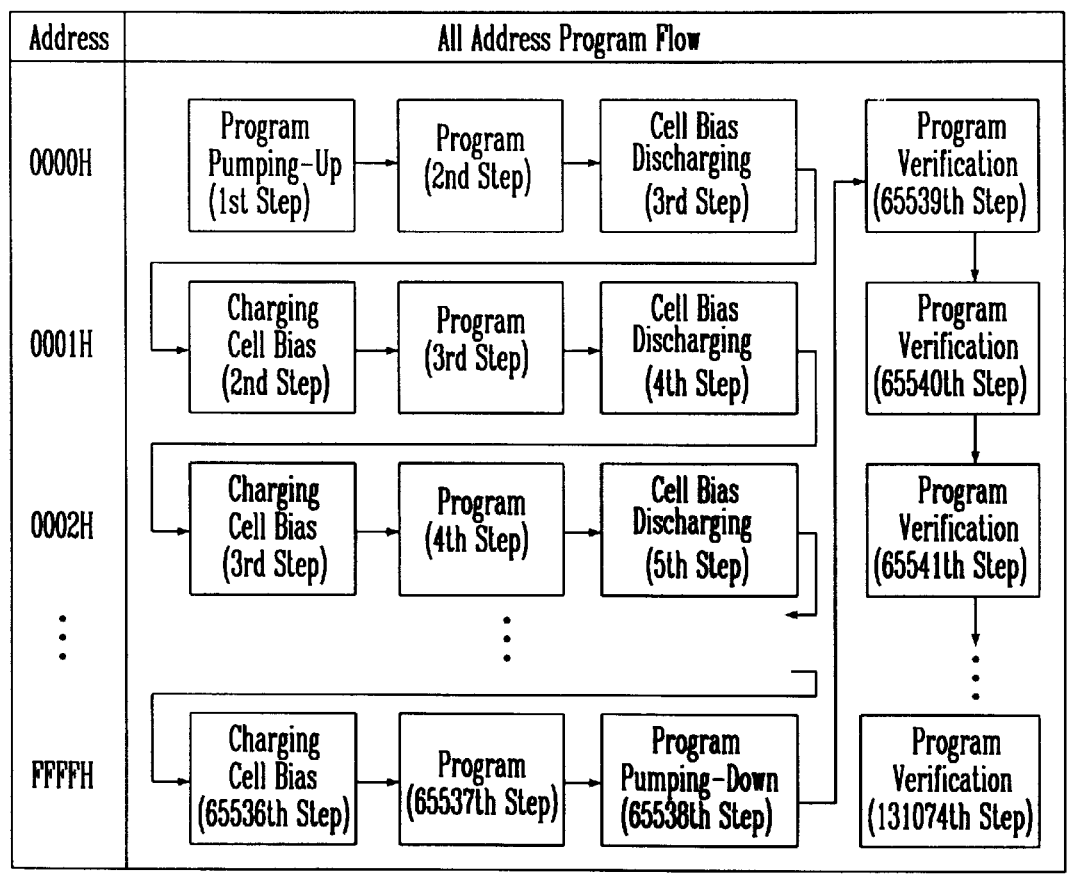

FIG. 11E is a functional block diagram to show the address and the address program flow in slight-programming of erasing the flash memory according to the 5th exemplification of the present invention, shown in FIG. 10. As shown in FIG. 10, execute programming for cells in a corresponding address(0000H) after pumping-down in slight-programming. Cell bias charging is executed for programming cells in the next address(0001H) and cell bias discharging for the cells in the former address when cells in the next address(0001H) are programmed. If programming is executed up to the final address(FFFFH) by such a method, program pumping-up is made and the program verification process is executed in cells.

When erasing of flash memory is executed by the above method, it is possible to get time gains as shown in the [Table 1] by comparison with a former case for the 8M element. The programming time in accordance with the present invention is the value when slight-programming of one cell is assumed to be 3 micro second.

[TABLE 1]

| Prior Art | | Present invention (Programming time for one cell: 3 us) | |
|---|---|---|---|
| Preprogramming Time | 7.3 sec | Slight-programming time (Reduced percentage) | |
| Postprogramming time | 76.8 msec | First embodiment | 3.1 sec (580%) |
| Total programming time | 7.4 sec | Second embodiment | Max. 3.6 sec (Min. 51%) |
| | | Third embodiment | 2.1 sec (72%) |
| | | Fourth embodiment | Max. 2.3 sec (Min. 61%) |
| | | Fifth embodiment | Less than 2 sec (more than 75%) |

As described above, the stack-gate flash memory erasing according to the present invention provides excellent effect to improve performance capability of elements by simplifying erasing of stack-gate flash memory into the erasing step and the slight-programming step and by reducing the time needed for erasing.

While the present invention has been described and illustrated herein with reference to the preferred embodiment thereof, it will be understood by those skilled in the art that various changes in form and details may be made therein without departing from the spirit and scope of the invention.

What is claimed is:

1. A method of erasing a flash memory, comprising the steps of:

(A) erasing all cells of a selected sector;
   (B) verifying in cells whether said cells are erased;
   (C) saving an address corresponding to a non-erased cell and re-erasing said cells when the non-erased cell is detected by said step (B);
   (D) verifying in cells, from the saved address to the final address whether the cells are erased; and
   (E) executing a slight-program for recovering over-erased cells so that all cells of said sector are normally erased.

2. The method of claim 1, wherein said slight-program comprising the steps of:

(a) programming said cells in bytes or words;
   (b) verifying in cells whether said cells are normally erased.

3. The method of claim 1, wherein said slight-program comprising the steps of;

(a) verifying in bytes or words whether said cells are normally erased;
   (b) programming, in bytes or words, cells corresponding to failed bytes or words; and
   (c) re-verifying in bytes or words whether the cells corresponding to the failed bytes or words are recovered.

4. The method of claim 1, wherein said slight-program comprising the steps of:

(a) programming said cells in bytes or words; and
   (b) verifying in columns whether said cells are normally erased.

5. The method of claim 1, wherein said slight-program comprising the steps of:

(a) verifying in columns whether said cells are normally erased;
   (b) programming, in columns, cells corresponding to failed columns; and
   (c) re-verifying in columns whether the cells corresponding to the failed columns are recovered.

6. The method of claim 1, wherein said slight-program comprising the steps of:

(a) executing pumping-up operation;
   (b) programming said cells in cells;
   (c) executing pumping-down operation; and
   (d) varying in cells whether said cells are normally erased.

* * * * *